United States Patent
Chen et al.

(10) Patent No.: US 10,158,004 B2
(45) Date of Patent: *Dec. 18, 2018

(54) SOURCE/DRAIN RECESS VOLUME TRIM FOR IMPROVED DEVICE PERFORMANCE AND LAYOUT DEPENDENCE

(71) Applicant: Taiwan Semiconductor Manufacturing Co., Ltd., Hsin-Chu (TW)

(72) Inventors: Chao-Hsuing Chen, Tainan (TW); Ling-Sung Wang, Tainan (TW); Chi-Yen Lin, Tainan (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/651,344

(22) Filed: Jul. 17, 2017

(65) Prior Publication Data

US 2017/0317186 A1   Nov. 2, 2017

Related U.S. Application Data

(63) Continuation of application No. 15/151,663, filed on May 11, 2016, now Pat. No. 9,735,252, which is a (Continued)

(51) Int. Cl.
*H01L 29/66* (2006.01)
*H01L 29/165* (2006.01)
(Continued)

(52) U.S. Cl.
CPC .. *H01L 29/66636* (2013.01); *H01L 21/02529* (2013.01); *H01L 21/02532* (2013.01);
(Continued)

(58) Field of Classification Search
None
See application file for complete search history.

(56) References Cited

U.S. PATENT DOCUMENTS 8,120,075 B1   2/2012   Luo et al.
9,385,215 B2 * 7/2016   Chen ............... H01L 29/66636
(Continued)

OTHER PUBLICATIONS

Non-Final Office Action dated Jul. 31, 2015 for U.S. Appl. No. 14/182,777.
(Continued)

*Primary Examiner* — Asok K Sarkar
(74) *Attorney, Agent, or Firm* — Eschweiler & Potashnik, LLC (57) ABSTRACT

Some embodiments of the present disclosure relates to a method of forming a semiconductor device having a strained channel and an associated device. In some embodiments, the method includes performing a first etching process by selectively exposing a substrate to a first etchant to produce a recess defined by sidewalls and a bottom surface of the substrate. An implantation process is performed to form an etch stop layer along the bottom surface. A second etching process is performed by exposing the sidewalls and the bottom surface defining the recess to a second etchant to form a source/drain recess. The source/drain recess laterally extends past the etch stop layer in opposing directions. A semiconductor material is formed within the source/drain recess.

20 Claims, 5 Drawing Sheets

Related U.S. Application Data continuation of application No. 14/182,777, filed on Feb. 18, 2014, now Pat. No. 9,385,215.

(60) Provisional application No. 61/790,741, filed on Mar. 15, 2013.

(51) Int. Cl.

| | | |
|---|---|---|
| *H01L 29/78* | (2006.01) | |
| *H01L 29/04* | (2006.01) | |
| *H01L 29/08* | (2006.01) | |
| *H01L 21/02* | (2006.01) | |
| *H01L 21/265* | (2006.01) | |
| *H01L 21/306* | (2006.01) | |
| *H01L 29/16* | (2006.01) | |

(52) U.S. Cl.
CPC .. *H01L 21/26506* (2013.01); *H01L 21/30604* (2013.01); *H01L 29/045* (2013.01); *H01L 29/0847* (2013.01); *H01L 29/165* (2013.01); *H01L 29/1608* (2013.01); *H01L 29/7848* (2013.01)

(56) References Cited

U.S. PATENT DOCUMENTS

| | | | |
|---|---|---|---|
| 9,735,252 B2* | 8/2017 | Chen | H01L 29/66636 |
| 2006/0115949 A1 | 6/2006 | Zhang et al. | |
| 2007/0190731 A1 | 8/2007 | Chen et al. | |
| 2010/0295127 A1 | 11/2010 | Cheng et al. | |
| 2011/0159655 A1 | 6/2011 | Adam et al. | |
| 2012/0058616 A1* | 3/2012 | Ahn | H01L 21/02532 |
| | | | 438/285 |
| 2013/0045589 A1 | 2/2013 | Kim et al. | |

OTHER PUBLICATIONS

Final Office Action dated Nov. 25, 2015 for U.S. Appl. No. 14/182,777.

Notice of Allowance dated Mar. 10, 2016 for U.S. Appl. No. 14/182,777.

Non-Final Office Action dated Oct. 19, 2016 for U.S. Appl. No. 15/151,663.

Notice of Allowance dated Apr. 12, 2017 for U.S. Appl. No. 15/151,663.

* cited by examiner

SOURCE/DRAIN RECESS VOLUME TRIM FOR IMPROVED DEVICE PERFORMANCE AND LAYOUT DEPENDENCE

CROSS REFERENCE TO RELATED APPLICATIONS

This Application is a Continuation of U.S. application Ser. No. 15/151,663 filed on May 11, 2016, which is a Continuation of U.S. application Ser. No. 14/182,777 filed on Feb. 18, 2014 (now U.S. Pat. No. 9,385,215 issued on Jul. 5, 2016), which claims priority to U.S. Provisional Patent Application 61/790,741 filed on Mar. 15, 2013. The contents of the above-referenced matters are hereby incorporated by reference in their entirety.

BACKGROUND

The following disclosure relates to semiconductor manufacturing methods. In particular, the following disclosure relates to method for forming a contact to a semiconductor device.

Strained-layer epitaxy to produce a strained channel with enhanced carrier mobility within a metal-oxide semiconductor field-effect transistor (MOSFET) is achieved through the formation of strained source and drain regions within the MOSFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Figure 1:
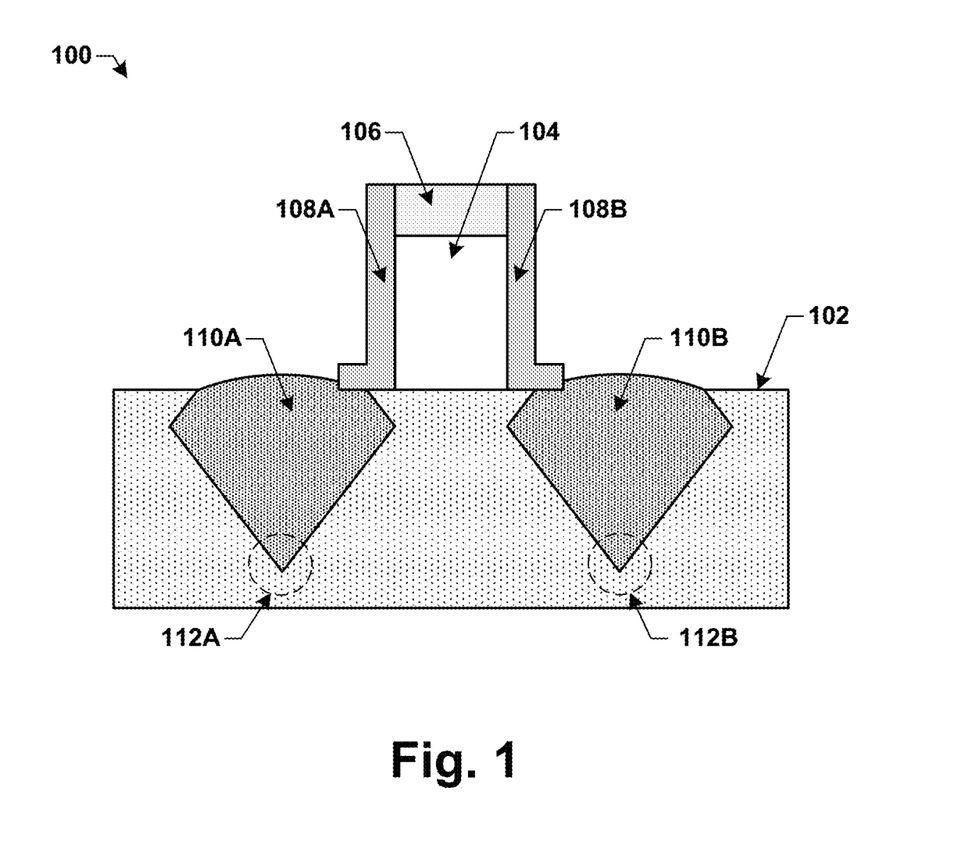
FIG. 1 illustrates a cross-sectional view of an exemplary MOSFET containing strained source and drain epitaxial regions.

Strained source and drain regions are formed within a MOSFET through the formation of a recess within the source or drain region, and the deposition of a strain-inducing layer within the recess. A germanium-containing material such a silicon germanium (SiGe) may be utilized for hole mobility enhancement of a p-channel MOSFET. SiGe deposited within the source or drain of the p-channel MOSFET will result in a uniaxial compressive strain within the channel due the increased lattice constant of germanium (Ge) over silicon (Si). Similarly, a carbon-containing material such as silicon carbide (SiC) may be utilized for electron mobility enhancement of an n-channel MOSFET. SiC deposited within the source or drain of the n-channel MOSFET will result in a uniaxial tensile strain within the channel due the decreased lattice constant of carbon (C) over Si. FIG. 1 illustrates a cross-sectional view of an exemplary MOSFET 100 formed on a Si or silicon-on-insulator (SOI) substrate 102 and containing a gate 104 residing beneath a hardmask layer 106 and isolated from source and drain regions by a first spacer 108A and a second spacer 108B, respectively. The source region comprises a first recess 110A comprising a diamond-shape or V-shape which has been filled with a stress-inducing material (e.g., SiGe, SiC, etc.) and a second recess 110B comprising an anisotropic etch profile (e.g., a diamond-shape or V-shape) which has been filled with the stress-inducing material.

For p-channel MOSFET channel mobility enhancement in advanced technology node development (i.e., Node-28 and below) a Ge concentration of greater than approximately 40% (e.g., $Si_{1-x}Ge_x$ where x>40%) may utilized within the first or second recess 110A, 110B. First or second SiGe dislocations 112A, 112B within the first or second respective recess 110A, 110B formed at the SiGe/substrate interface can degrade device performance of the p-channel MOSFET 100, as well as distort the topologies of subsequent layers disposed above the stress-inducing material.

Accordingly, some embodiments of the present disclosure relates to a method and a device to achieve a strained channel. A volume of a source or drain recess is controlled by a performing an etch of a substrate to produce a recess. An anisotropic etch stop layer is then formed by doping a bottom surface of the recess with a boron-containing dopant, which distorts the crystalline structure of the bottom surface. An anisotropic etch of the recess is then performed. The anisotropic etch stop layer resists anisotropic etching such that the recess comprises a substantially flat bottom surface after the anisotropic etch. The source or drain recess is then filled with a stress-inducing material to produce a strained channel.

Figure 2A:
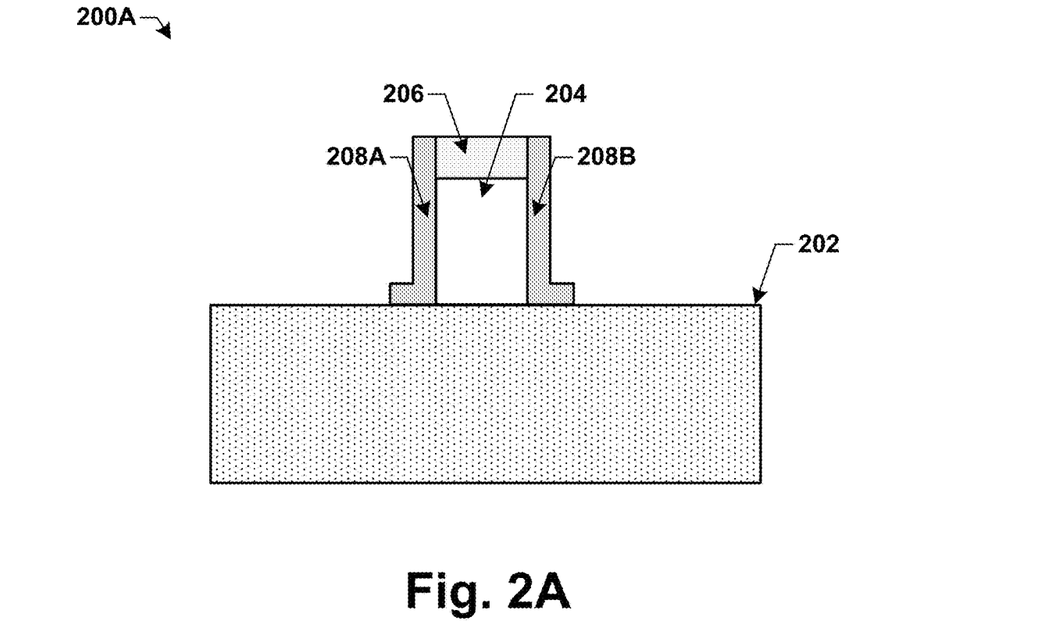
FIGS. 2A-2E illustrate some embodiments of recess formation.

FIGS. 2A-2E illustrate some embodiments of recess formation. FIG. 2A illustrates a cross-sectional view of a device 200A formed on a substrate 202. In some embodiments, the substrate 202 comprises silicon (Si) or silicon-on-insulator (SOI), whereupon a gate 204 (e.g., poly-silicon, replacement metal, etc.) is disposed beneath a hardmask layer 206 (e.g., $SiO_2$ or other dielectric) and isolated from source and drain regions by a first spacer 208A (e.g., SiO$_2$ or other dielectric) and a second spacer 208B, respectively.

Figure 2B:
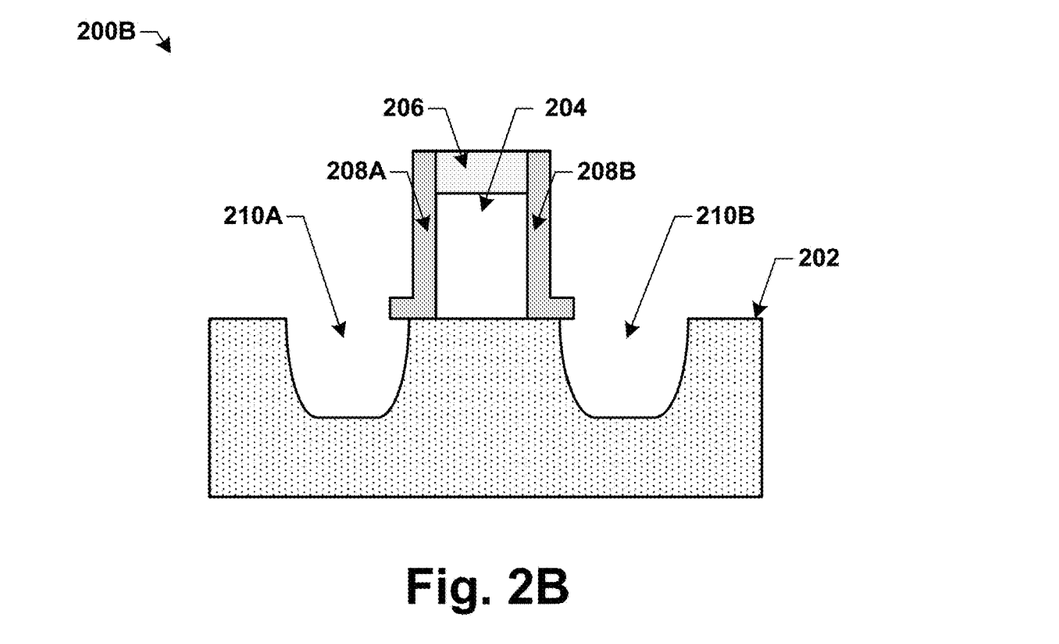

FIG. 2B illustrates a cross-sectional view of a device 200B comprising the device 200A where an etch of the substrate 202 is performed to produce a first recess 210A within the source region, where the first recess comprises a U-shaped etch profile. The etch of the substrate 202 also produces a second recess 210B within the drain region also comprising a U-shaped etch profile. One or more etching processes may be used to recess the source and drain regions to produce the U-shaped etch profile.

In some embodiments, the etch used to recess the source and drain regions comprises an isotropic etch to produce an isotropic etch profile. In some embodiments, the etch comprises an anisotropic etch to produce an anisotropic etch profile. In some embodiments, the etch is performed in two or more steps that comprise a combination of and anisotropic elements. These elements can comprise dry process(es), such as a plasma etching process, wet etching process(es), reactive ion etching (RIE) processes, or a combination thereof. Such processes may include bombarding the substrate with ions (e.g., fluorocarbons, oxygen, chlorine, nitrogen, argon, helium, etc.) that dislodge portions of the material from the substrate 202.

Figure 2C:
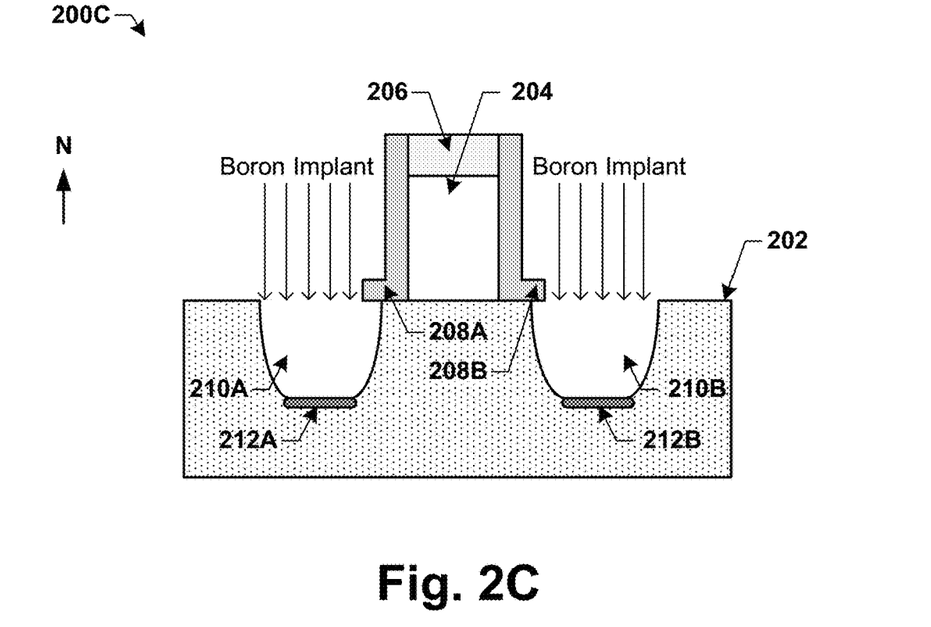

FIG. 2C illustrates a cross-sectional view of a device 200C comprising the device 200B where a first anisotropic etch stop layer 212A is formed in the first recess 210A by doping a bottom surface of the first recess 210A with a dopant. Similarly, a second anisotropic etch stop layer 212B is formed in the second recess 210B by doping a bottom surface of the second recess 210B with the dopant. For the embodiments of FIGS. 2A-2E, the dopant comprises a boron-containing material, and the doping is achieved through an ion implantation technique, performed at a zero angle with a normal vector N to a surface of the substrate 202. An ionized boron implant dose of greater than approximately 2e15 keV is demonstrated produce a boron concentration of greater than approximately 1e20 atoms/cm$^3$ within the first or second anisotropic etch stop layers 212A, 212B. The ion implantation technique is utilized at a zero angle with respect to N to achieve a distortion of the crystalline structure of the substrate 202 on a bottom surface of the first and second recess 210A, 210B such that sidewalls of the first and second recesses 210A, 210B are not distorted.

Figure 2D:
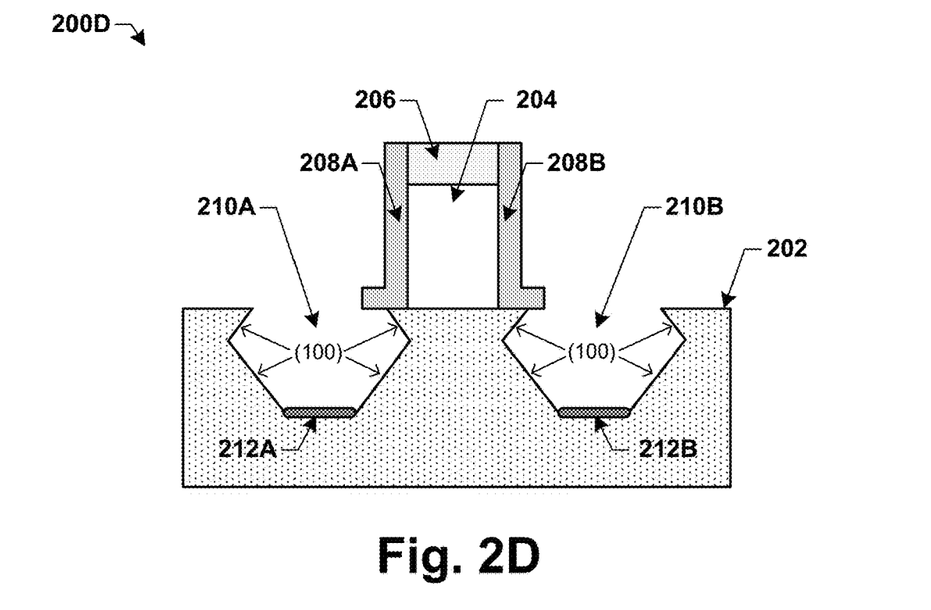

FIG. 2D illustrates a cross-sectional view of a device 200D comprising the device 200C where an anisotropic etch of the first and second recess 210A, 210B is performed. The first and second anisotropic etch stop layers 212A, 212B resists anisotropic etching such that the first and second recess 210A, 210B comprise substantially flat bottom surfaces. A boron impurity concentration of greater than approximately 1e20 atoms/cm$^3$ within the first or second anisotropic etch stop layers 212A, 212B is sufficient to prevent etching of the substantially flat bottom surfaces of the first and second recesses 210A, 210B.

The anisotropic etch of FIG. 2D comprises a wet etch. Some wet etchants etch crystalline materials at different rates depending upon which crystal face is exposed, resulting in an anisotropic etch. An etchant such as carbon tetrafluoride (CF4), HF, tetramethylammonium hydroxide (TMAH), or combinations of thereof, may be used to perform the wet etch of the first and second recesses 210A, 210B. Other etchants such as potassium hydroxide (KOH) may be utilized for selective etching of silicon in the <100> direction. Ethylene diamine pyrocatechol (EDP) may also be utilized, and does not etch silicon dioxide as KOH does. TMAH demonstrates approximately twice the selectivity between the <100> and <111> directions in silicon over EDP. For the wet etch of FIG. 2D, the TMAH etchant demonstrates a high degree of selectivity between the (100) sidewalls of the first and second recesses 210A, 210B and the first and second anisotropic etch stop layers 212A, 212B due to the boron impurity concentration of greater than approximately 1e20 atoms/cm$^3$ within the first and second anisotropic etch stop layers 212A, 212B, and resulting distortion of the lattice structure of the substrate 202.

The etch profiles of the first and second recesses 210A, 210B other than the bottom surfaces comprises a (100) crystal orientation after the anisotropic etch. For the embodiments of FIG. 2D the wet etch which utilizes TMAH as an etchant configured for preferred etch selectivity in the <100> direction. The boron-containing material distorts a crystal orientation of the bottom surface such that the TMAH etchant demonstrates non-preferred etch selectivity in a direction of the bottom surface.

In some embodiments, the anisotropic etch performed in FIG. 2B produces a first depth of the first and second recesses 210A, 210B of between approximately 60 nm and approximately 70 nm. A second depth after the isotropic etch of the first and second recesses 210A, 210B is approximately equal to a first depth due to the first and second anisotropic etch stop layers 212A, 212B.

Figure 2E:
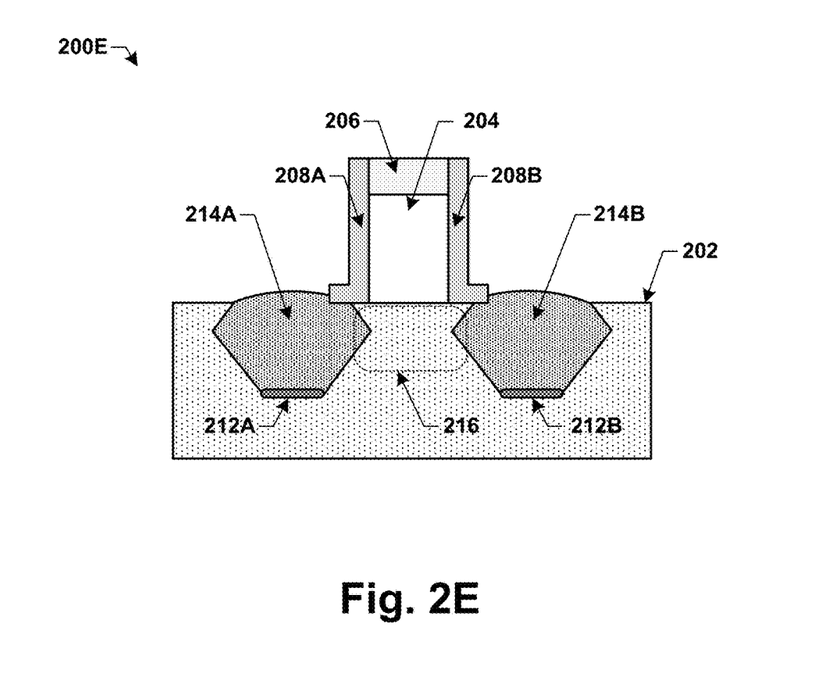

FIG. 2E illustrates a cross-sectional view of a device 200E comprising the device 200D where a first stress-inducing material 214A is deposited in the first recess 210A and a second stress-inducing material 214B is deposited in the second recess 210B through an epitaxial growth technique. In some embodiments, the epitaxial growth technique comprises chemical vapor deposition (CVD). Some derivative CVD processes further comprise low pressure CVD (LP-CVD), atomic layer CVD (ALCVD), ultrahigh vacuum CVD (UHVCVD), reduced pressure CVD (RPCVD), or any combinations thereof. Molecular beam epitaxy (MBE) or metalorganic vapor phase epitaxy (MOVPE) may also be utilized for epitaxial growth. Another method, cyclic deposition-etch (CDE) epitaxy, comprises periodic exposure of the substrate 202 to the material though CVD or other epitaxial method, while periodically exposing the substrate 202 to no material, and so on, until a desired epitaxial layer is deposited. Throughout the CDE process, the substrate 202 is exposed to a continuous flow of one or more vapor etchants configured to selectively etch away amorphous portions of the epitaxial layer while leaving crystalline portions intact, facilitating high crystal quality for enhanced strain. Selective epitaxial growth (SEG) process may also be utilized, wherein simultaneous deposition and etch may be used to deposit the epitaxial layer.

The epitaxial layers of the first and second stress-inducing materials 214A, 214B within the first and second recesses 210A, 210B are configured to produce a strain within a channel region 216 of the device 200E to increase the mobility of charge carriers within the channel region 216, and thus increase the performance of the device 200E under static biasing conditions. A germanium-containing material such as SiGe may be utilized for hole mobility enhancement of a p-channel MOSFET due to a uniaxial compressive strain within the channel region 216. Likewise, a carbon-containing material such as SiC may be utilized for electron mobility enhancement of an n-channel MOSFET due to a uniaxial tensile strain within the channel region 216. For the embodiments of FIG. 2E, the first and second stress-inducing materials 214A, 214B comprise silicon-germanium (SiGe) comprising a germanium composition of greater than 40%.

Figures 3A, 3B:
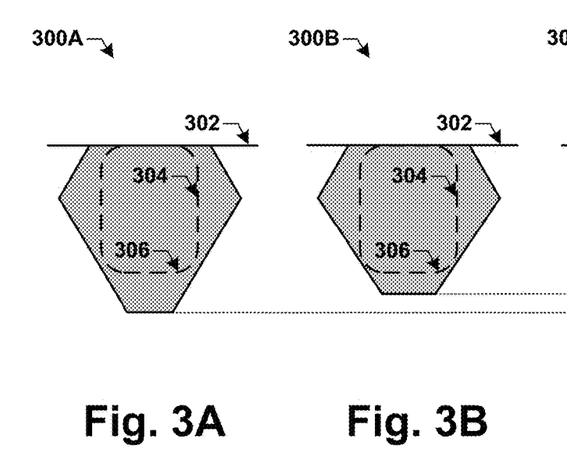
FIGS. 3A-3C illustrate cross-sections of some embodiments of recess formation as a function of etch stop layer dopant concentration.
Figure 3C:
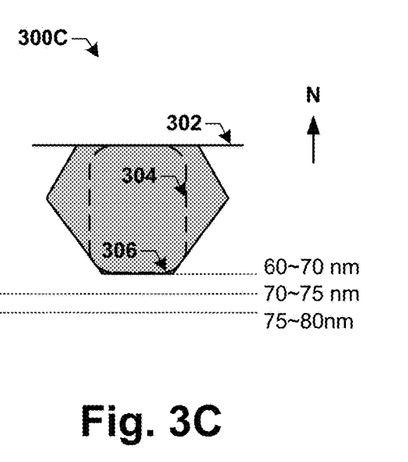

FIGS. 3A-3C illustrate cross-sections of some embodiments of recess formation as a function of etch stop layer dopant concentration. By varying the ionized boron implant energy in a range between approximately 2E13 keV and approximately 2E15 keV, the selectivity of the anisotropic etch may be enhanced between the bottom surface and sidewalls of a respective recess. FIG. 3A illustrates a cross-section of a first anisotropic recess 300A formed within a substrate comprising a surface 302. The first anisotropic recess 300A may be formed by multiple etch process comprising an isotropic dry etch (e.g., plasma etch) to form an isotropic recess 304 formed with a depth of between approximately 60 nm and approximately 70 nm, which is doped with ionized boron through an ion implant performed antiparallel to a normal vector N to the surface 302, and with an implant energy of approximately 2E13 keV to form a first etch stop layer with a boron concentration of approximately 1e18 atoms/cm$^3$. Subsequent to first etch stop layer formation, an anisotropic wet etch is performed with TMAH, which demonstrates selectivity between the sidewalls of the isotropic recess 304 and the first etch stop layer such that the sidewalls are etched anisotropically in the <100> direction, while the first etch stop layer resists etching, but is etched such that the first anisotropic recess 300A resulting from the anisotropic etch has a depth of between approximately 75 nm and approximately 80 nm.

FIG. 3B illustrates a cross-section of a second anisotropic recess 300B, which is formed in a manner similar to the first anisotropic recess 300A, wherein only the implant energy of the boron implant is altered. Upon formation of the isotropic recess 304, the bottom surface is doped with ionized boron with an implant energy of approximately 2E14 keV to form a second etch stop layer with a boron concentration of approximately 1e19 atoms/cm$^3$. The subsequent anisotropic wet etch performed with TMAH demonstrates increased selectivity between the sidewalls of the isotropic recess 304 and the second etch stop layer due to the increased boron concentration, such that the anisotropic etch results in a depth of between approximately 70 nm and approximately 75 nm. FIG. 3C illustrates a cross-section of a third anisotropic recess 300C formed in the same manner as the first and second anisotropic recesses 300A, 300B, wherein only the implant energy of the boron implant is altered to approximately 2E15 keV, resulting in a boron concentration of greater than approximately 1e20 atoms/cm$^3$ within a resulting third etch stop layer at the bottom surface 306. The increased selectivity between the sidewalls and the bottom surface 306 results in essentially no etching of the bottom surface due to the third etch stop layer, such that the third anisotropic recess 300C comprises a substantially flat bottom surface 306, and further comprises a depth of between approximately 60 nm and approximately 70 nm, which is the original depth of the isotropic recess 304. The third anisotropic recess 300C may then be filled with a stress-inducing material. In some embodiments, the stress-inducing material comprises SiGe comprising a germanium composition of greater than 40% for a p-channel MOSFET. In some embodiments, the stress-inducing material comprises a carbon-containing material such as SiC for an n-channel MOSFET.

Figure 4:
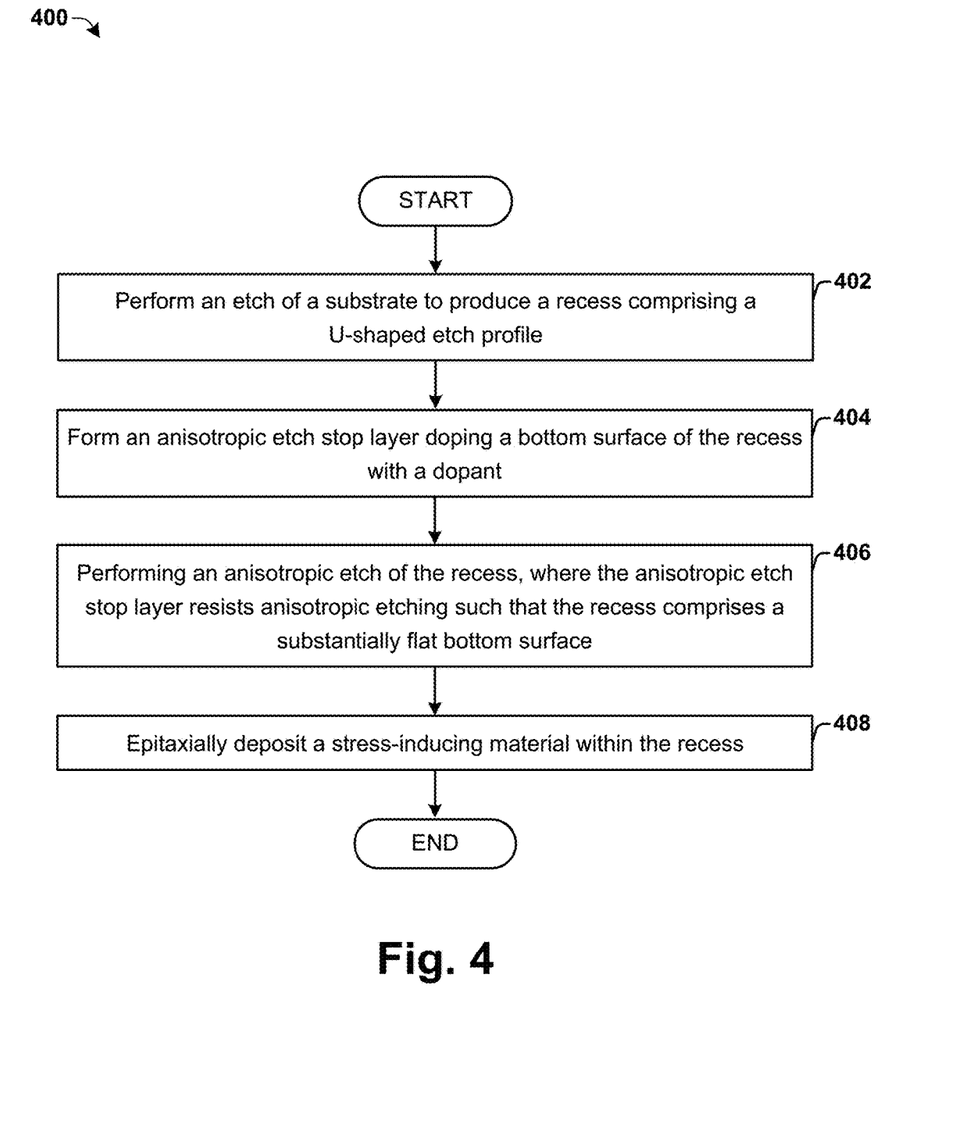
FIG. 4 illustrates some embodiments of a method of recess formation.

FIG. 4 illustrates some embodiments of a method 400 of recess formation. While the method 400 is illustrated and described as a series of acts or events, it will be appreciated that the illustrated ordering of such acts or events are not to be interpreted in a limiting sense. For example, some acts may occur in different orders or concurrently with other acts or events apart from those illustrated or described herein. In addition, not all illustrated acts may be required to implement one or more aspects or embodiments of the description herein. Further, one or more of the acts depicted herein may be carried out in one or more separate acts or phases.

At 402, an etch of a substrate is performed to produce a recess comprising a U-shaped etch profile. The substrate may comprise a silicon (Si) or silicon-on-insulator (SOI) substrate. In some embodiments, the etch comprises a dry etch, wet etch, plasma etch, RIE etch, or a combination thereof.

At 404, an anisotropic etch stop layer is formed through an ion implantation technique by implanting a dopant comprising a boron-containing material on a bottom surface of the recess. The implant distorts a crystal orientation of the bottom surface of the recess such that an anisotropic etchant will demonstrate a non-preferred etch selectivity in a direction of the bottom surface. The implantation is performed through an ion implantation technique at a zero angle with a normal vector to the substrate surface and with an implant energy of greater than approximately 1e15 keV produce a boron impurity concentration of greater than approximately 1e20 atoms/cm$^3$ within the bottom surface.

At 406, an anisotropic etch of the recess is performed, wherein the anisotropic etch stop layer resists anisotropic etching such that the recess comprises a substantially flat bottom surface. In some embodiments, the anisotropic etch comprises a wet etch which utilizes TMAH as an etchant configured for preferred etch selectivity in the <100> direction of the Si or SOI substrate. The resultant etch profile of the recess other than the bottom surface comprises a (100) crystal orientation after the anisotropic etch. For a large enough boron impurity concentration a second depth of the recess after the anisotropic etch is approximately equal to a first depth of the recess after the isotropic etch, because the bottom surface is not etched.

At 408, a stress-inducing material is epitaxially deposited within the recess. The stress-inducing material may comprise SiGe comprising a germanium composition of greater than 40%, or a carbon-containing material such as SiC.

It will also be appreciated that equivalent alterations or modifications may occur to one of ordinary skill in the art based upon a reading or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features or aspects of other implementations as may be desired. Furthermore, to the extent that the terms "includes", "having", "has", "with", or variants thereof are used herein; such terms are intended to be inclusive in meaning—like "comprising." Also, "exemplary" is merely meant to mean an example, rather than the best. It is also to be appreciated that features, layers or elements depicted herein are illustrated with particular dimensions or orientations relative to one another for purposes of simplicity and ease of understanding, and that the actual dimensions or orientations may differ substantially from that illustrated herein.

Therefore, some embodiments of the present disclosure relates to a method and a device to achieve a strained channel. A volume of a source or drain recess is controlled by a performing an etch of a substrate to produce a recess. An anisotropic etch stop layer is then formed by doping a bottom surface of the recess with a boron-containing dopant, which distorts the crystalline structure of the bottom surface. An anisotropic etch of the recess is then performed. The anisotropic etch stop layer resists anisotropic etching such that the recess comprises a substantially flat bottom surface after the anisotropic etch. The source or drain recess is then filled with a stress-inducing material to produce a strained channel.

In some embodiments the present disclosure relates to a method of forming a semiconductor device. The method includes performing a first etching process by selectively exposing a substrate to a first etchant to produce a recess defined by sidewalls and a bottom surface of the substrate, and performing an implantation process to form an etch stop layer along the bottom surface. The method further includes performing a second etching process by exposing the sidewalls and the bottom surface defining the recess to a second etchant to form a source/drain recess. The source/drain recess laterally extends past the etch stop layer in opposing directions. The method further includes forming a semiconductor material within the source/drain recess.

In some embodiments the present disclosure relates to a semiconductor device. The semiconductor device includes a source region and a drain region comprising an epitaxial material arranged within a substrate. A doped region is arranged along lower surfaces of the source region and the drain region. The source region and the drain region have angled sidewalls that are angled away from the doped region in opposing directions. A gate structure is arranged over the substrate at a location that is between the source region and the drain region.

In some embodiments the present disclosure relates to a semiconductor device. The semiconductor device includes a source region and a drain region comprising a semiconductor material arranged within a substrate. An etch stop layer is arranged along lower surfaces of the source region and the drain region. The semiconductor material has angled sidewalls and a curved upper surface facing away from the etch stop layer. A gate structure is arranged over the substrate at a location that is between the source region and the drain region.

What is claimed is:

1. A semiconductor device, comprising:
   a source region and a drain region comprising an epitaxial material arranged within a substrate;
   a doped region arranged along lower surfaces of the source region and the drain region, wherein the source region and the drain region have angled sidewalls that are angled away from the doped region in opposing directions, wherein the angled sidewalls intersect outermost edges of the doped region at points below a top of the doped region; and
   a gate structure arranged over the substrate at a location that is between the source region and the drain region.

2. The semiconductor device of claim 1, wherein a dopant concentration of the doped region is greater than approximately 1e20 atoms/cm$^3$.

3. The semiconductor device of claim 1,
   wherein the source region has sidewalls comprising a lower segment oriented at a first angle and an upper segment over the lower segment and oriented at a second angle different than the first angle; and
   wherein the lower segment has a greater length than the upper segment along a cross-sectional view.

4. The semiconductor device of claim 1, wherein the epitaxial material comprises silicon germanium.

5. The semiconductor device of claim 1,
   wherein the source region has sidewalls comprising a lower segment oriented at a first angle and an upper segment over the lower segment and oriented at a second angle different than the first angle; and
   wherein the lower segment extends to a vertical position that is above a median height of the source region.

6. The semiconductor device of claim 1, wherein the source region has a cross-sectional profile that is substantially symmetric about a line normal to a surface of the substrate contacting a bottom surface of the source region.

7. The semiconductor device of claim 1,
   wherein the lower surface of the source region is a substantially flat lower surface; and
   wherein the lower surface of the source region has a first width that is smaller than a second width of the source region along a plane extending along a bottom of the gate structure.

8. A semiconductor device, comprising:
   a source region and a drain region comprising a semiconductor material arranged within a substrate;
   an etch stop layer having a top surface arranged along and confined below a substantially flat lower surface of the source region or the drain region, wherein the semiconductor material has angled sidewalls and an upper surface facing away from the etch stop layer, the upper surface defining a curved surface that continuously extends from directly over the substantially flat lower surface of the source region to laterally past opposing outermost edges of the substantially flat lower surface of the source region; and
   a gate structure arranged over the substrate at a location that is between the source region and the drain region.

9. The semiconductor device of claim 8,
   wherein the lower surface of the source region has a first width that is smaller than a second width of the source region along a plane extending along a top of the substrate.

10. The semiconductor device of claim 8,
    wherein the source region has sidewalls comprising a lower segment and an upper segment oriented at different angles; and
    wherein the lower segment has a greater length than the upper segment along a cross-sectional view.

11. The semiconductor device of claim 8,
    wherein the source region has sidewalls comprising a lower segment and an upper segment oriented at different angles; and
    wherein the lower segment extends to a vertical position that is above a median height of the source region.

12. The semiconductor device of claim 8, wherein the source region is asymmetric about a horizontal line bisecting the source region.

13. The semiconductor device of claim 8, wherein the source region laterally extends past the etch stop layer in opposite directions.

14. A semiconductor device, comprising:
    a source region and a drain region comprising an epitaxial material arranged within a substrate;
    a doped region arranged below the source region and the drain region, wherein the source region and the drain region have angled sidewalls that extend below a top of the doped region, wherein the doped region has an uppermost surface that is bound between axes extending along the angled sidewalls; and
    a gate structure arranged over the substrate at a location that is between the source region and the drain region.

15. The semiconductor device of claim 14, wherein the source region laterally extends past the doped region in opposite directions.

16. The semiconductor device of claim 14,
wherein the doped region is not disposed directly below the gate structure; and
wherein the source region and the drain region are disposed directly below the gate structure.

17. The semiconductor device of claim 14, wherein a top surface of the source region is wider than a bottom surface of the source region.

18. The semiconductor device of claim 14, wherein the source region protrudes outward from within the substrate.

19. The semiconductor device of claim 14, wherein the source region is asymmetric about a horizontal line bisecting the source region.

20. The semiconductor device of claim 14,
wherein the gate structure comprises sidewall spacers located along opposing sides of the gate structure; and
wherein the doped region is laterally offset from the sidewall spacers by a non-zero distance.

* * * * *